United States Patent
Jao et al.

(10) Patent No.: US 11,742,845 B2
(45) Date of Patent: Aug. 29, 2023

(54) SWITCH DEVICE

(71) Applicant: RichWave Technology Corp., Taipei (TW)

(72) Inventors: Hsiang-Jen Jao, Taipei (TW); Tien-Yun Peng, Taipei (TW); Chih-Sheng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 17/565,475

(22) Filed: Dec. 30, 2021

(65) Prior Publication Data

US 2023/0179194 A1  Jun. 8, 2023

(30) Foreign Application Priority Data

Dec. 6, 2021 (TW) ................... 110145404

(51) Int. Cl.
*H03K 17/0412* (2006.01)
(52) U.S. Cl.
CPC .............................. *H03K 17/04123* (2013.01)
(58) Field of Classification Search
CPC ........... H03K 17/04123; H03K 17/693; H03K 17/687; H03K 17/102; H03K 17/162; H03F 1/30; H03F 1/56; H03F 1/523; H03F 3/45179; H03F 3/45183; H03F 1/0261; H03F 3/195; H03F 1/565; H03F 3/45071; H03F 1/52; H03F 2203/7206; H03F 3/72; H03F 3/19; H03F 3/45475; H03F 2200/24; H03F 2203/30027; H04B 1/48; H03D 7/1458
See application file for complete search history.

(56) References Cited

U.S. PATENT DOCUMENTS

| | | | |
|---|---|---|---|
| 6,975,848 B2 | 12/2005 | Rawlins | |
| 7,265,604 B2* | 9/2007 | Yasuda | H03K 17/693 333/81 R |
| 9,941,347 B2* | 4/2018 | Shapiro | H01L 28/20 |
| 10,396,772 B2* | 8/2019 | Shanjani | H03K 17/04123 |

(Continued)

OTHER PUBLICATIONS

Office action dated Jul. 5, 2022 for the Taiwan application No. 110145404, filing date Dec. 6, 2021, pp. 1-5, Jul. 5, 2022.

*Primary Examiner* — John W Poos
*Assistant Examiner* — Tyler J Pereny
(74) *Attorney, Agent, or Firm* — Winston Hsu

(57) ABSTRACT

A switch device includes a first radio-frequency (RF) terminal, a second RF terminal, a first transistor, a second transistor, and a variable resistance element. The first transistor includes a first terminal coupled to the first RF terminal, a second terminal, and a control terminal coupled to a control signal terminal providing a control signal. The second transistor includes a first terminal coupled to the second terminal of the first transistor, a second terminal coupled to the second RF terminal, and a control terminal. The variable resistance element is coupled between the second terminal of the first transistor and a bias voltage terminal. When the first transistor and the second transistor are in a transient state, the variable resistance element provides a lower resistance. When the first transistor and the second transistor are in an ON state, the variable resistance element provides a higher resistance.

19 Claims, 9 Drawing Sheets

(56) References Cited

U.S. PATENT DOCUMENTS

| | | | | |
|---|---|---|---|---|
| 2014/0062218 A1* | 3/2014 | Chih-Sheng | ......... | H03K 17/693 |
| | | | | 307/109 |
| 2015/0303978 A1* | 10/2015 | Chen | ................ | H04W 52/0274 |
| | | | | 455/78 |
| 2018/0309406 A1* | 10/2018 | Yun | ...................... | H03B 5/1265 |

* cited by examiner

SWITCH DEVICE

TECHNICAL FIELD

The disclosure is related to a switch device, and more particularly, a switch device capable of reducing an impact caused by a control signal to a voltage of a node, and/or speeding up a transient response.

BACKGROUND

A switch device may be used on a transmission path of signals, and a plurality of transistors coupled in series may be arranged on the transmission path to avoid signal distortion and device damage caused by signals with higher power.

However, when a plurality of transistors coupled in series are switched between an ON state and an OFF state, the voltage change at the control terminal of each transistor may impact voltages at drain/source terminals thereof by ways of a capacitive coupling, which may result in a slow transient response and may make it difficult for the transistor to enter the ON state or the OFF state in time. As a result, it is difficult to improve the operation speed of the circuit. For this reason, an appropriate solution is still in need to deal with the related difficulties and improve the performance of the circuit.

SUMMARY

An embodiment may provide a switch device comprising a first radio-frequency (RF) terminal, a second RF terminal, a first transistor, a second transistor and a first variable resistance element. The first RF terminal is configured to receive an RF signal, and coupled to a bias voltage terminal providing a bias voltage. The second RF terminal is configured to receive the RF signal through a predetermined path, and coupled to the bias voltage terminal. The predetermined path is between the first RF terminal and the second RF terminal. The first transistor comprises a first terminal coupled to the first RF terminal, a second terminal, and a control terminal. The second transistor comprises a first terminal coupled to the second terminal of the first transistor, a second terminal coupled to the second RF terminal, and a control terminal. The variable resistance element comprises a first terminal coupled to the second terminal of the first transistor, and a second terminal coupled to the bias voltage terminal. The variable resistance element provides a first resistance when the first transistor and the second transistor are in a transient state according to a first control signal, and the variable resistance element provides a second resistance larger than the first resistance when the first transistor and the second transistor are in an ON state.

Another embodiment provides a switch device comprising a first radio-frequency (RF) terminal, a second RF terminal, a transistor, a second transistor and a first capacitor. The first RF terminal is configured to receive an RF signal, and coupled to a bias voltage terminal providing a bias voltage. The second RF terminal is configured to receive the RF signal through a predetermined path, and coupled to the bias voltage terminal. The predetermined path is between the first RF terminal and the second RF terminal. The first transistor comprises a first terminal coupled to the first RF terminal, a second terminal, and a control terminal for receiving a first control signal. The second transistor comprises a first terminal coupled to the second terminal of the first transistor, a second terminal coupled to the second RF terminal, and a control terminal for receiving the first control signal. The capacitor is coupled between the second terminal of the first transistor and a second control signal terminal providing a second control signal. When the first transistor and the second transistor are in a transient state according to the first control signal, the first control signal changes from a first level to a second level, and the second control signal changes from a third level to a fourth level.

DETAILED DESCRIPTION

Figure 1:
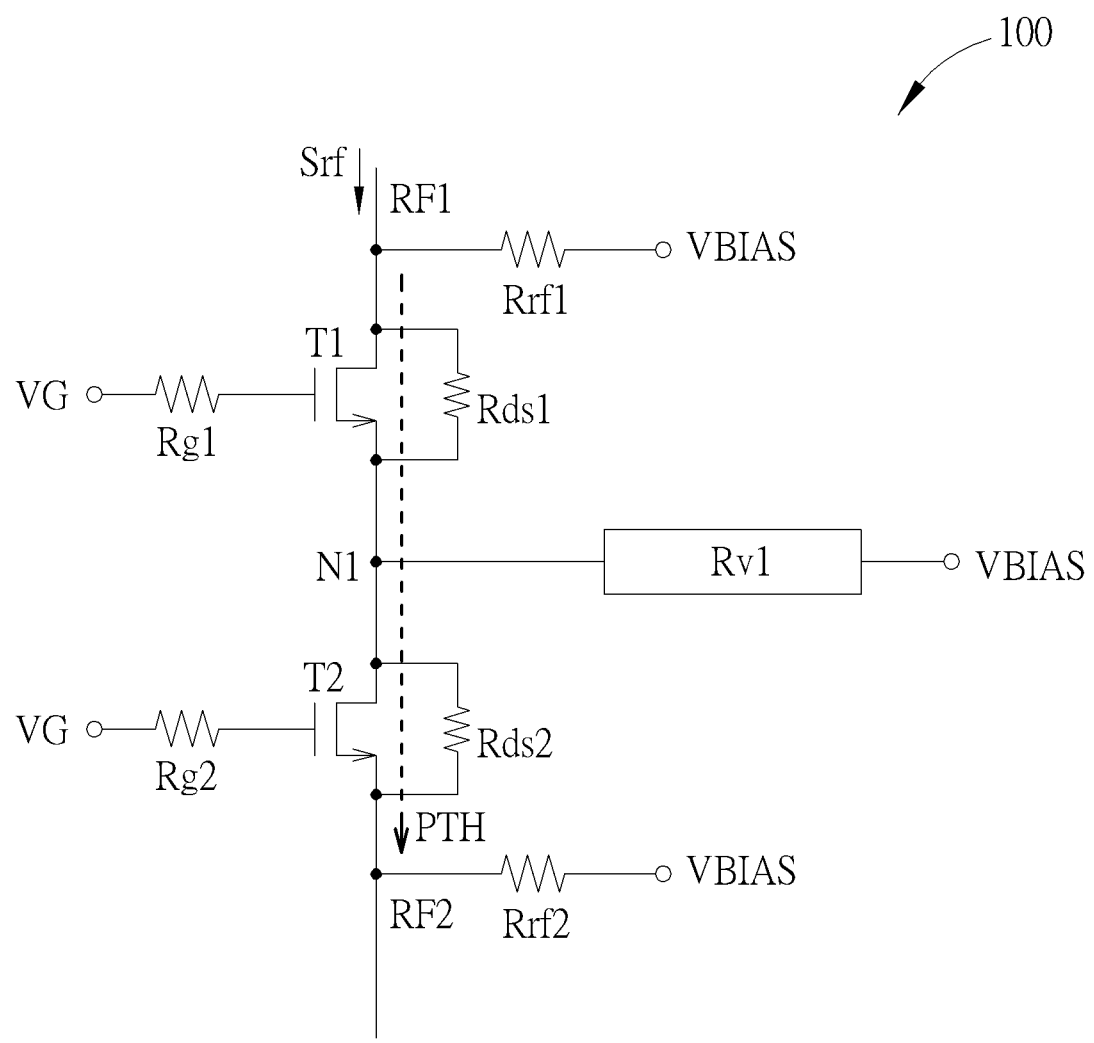
FIG. 1 illustrates a switch device according to an embodiment.

Below, exemplary embodiments may be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

In order to deal with the abovementioned problems, embodiments may provide switch devices as various solutions. Herein, when it is mentioned that a first value is substantially equal to a second value, the description may include the case where the difference between the first value and the second value is not greater than 10% of one of the two values. Herein, when a set of elements is mentioned, the set of elements may include one element or a plurality of elements.

FIG. 1 illustrates a switch device 100 according to an embodiment. The switch device 100 may include a first radio-frequency (RF) terminal RF1, a second RF terminal RF2, a first transistor T1, a second transistor T2 and a variable resistance element Rv1. The first RF terminal RF1 may be used to receive an RF signal Srf, and coupled to a bias voltage terminal VBIAS providing a bias voltage. The second RF terminal RF2 may be used to receive the RF signal Srf through a predetermined path PTH, and the second RF terminal RF2 may be coupled to the bias voltage terminal VBIAS. The predetermined path PTH may be between the first RF terminal RF1 and the second RF terminal RF2. The first transistor T1 may include a first terminal, a second terminal and a control terminal, where the first terminal is coupled to the first RF terminal RF1, and the control terminal is coupled to a control signal terminal VG providing a control signal. The second transistor T2 may include a first terminal, a second terminal and a control terminal, where the first terminal is coupled to the second terminal of the first transistor T1, the second terminal is coupled to the second RF terminal RF2, and the control terminal is coupled to the control signal terminal VG. The variable resistance element Rv1 may include a first terminal and a second terminal, where the first terminal is coupled to the second terminal of the first transistor T1, and the second terminal is coupled to the bias voltage terminal VBIAS. As shown in FIG. 1, for example, the first terminal of the second transistor T2 and the second terminal of the first transistor T1 may be coupled to an intermediate node N1, and the first terminal of the variable resistance element Rv1 may be coupled to the intermediate node N1 in this case. According to the embodiment shown in FIG. 1, the control terminals of the first transistor T1 and the second transistor T2 may be coupled to the same control signal terminal VG. However, embodiments are not limited thereto. According to another embodiment, the control terminals of the first transistor T1 and the second transistor T2 may be coupled to different control signal terminals, where the different control signal terminals are used to respectively control the first transistor T1 and the second transistor T2 so that the first transistor T1 and the second transistor T2 may be in a transient state or in a stable state synchronously.

The first transistor T1 and the second transistor T2 may be in an ON state, an OFF state, switched from the ON state to the OFF state, and/or switched from the OFF state to the ON state according to the control signal (e.g., a voltage signal) provided by the control signal terminal VG. The ON state and the OFF state may be regarded as stable states of the transistors. When the first transistor T1 and the second transistor T2 are switched between the ON state and the OFF state according to the control signal provided by the control signal terminal VG, the transistors are in transient states. For example, when the voltage at the control terminal (coupled to the control signal terminal VG in FIG. 1) of the first transistor T1 changes from a lower level to a higher level, the first transistor T1 may be switched from an OFF state to an ON state. Due to the capacitive coupling between the control terminal and the second terminal (e.g., source terminal) of the first transistor T1, which may be resulted from a parasitic capacitor there-between, the voltage at the second terminal (e.g., source terminal) may be impacted, for example, pulled higher, by the voltage change at the control terminal. The voltage difference between the control terminal and the second terminal of the first transistor T1 may therefore be reduced, and the switching speed of the first transistor T1 may also be slowed accordingly.

By means of the structure of the switch device 100, voltage at the second terminal of a transistor (e.g., the transistor T1) may have a flattened curve versus time. As a result, the switching speed of the transistor may be improved, and the transient response may be speeded up.

According to an embodiment, the first transistor T1 and the second transistor T2 may be N-type or P-type. When the first transistor T1 and the second transistor T2 are N-type, the first terminals, the second terminals and the control terminals thereof may be drain terminals, source terminals and gate terminals respectively. In this condition, the first transistor T1 and the second transistor T2 are in ON state when the control signal (e.g., a voltage signal) provided by the control signal terminal VG is at a high level, and the first transistor T1 and the second transistor T2 are in OFF state when the control signal provided by the control signal terminal VG is at a low level. According another embodiment, when the first transistor T1 and the second transistor T2 are P-type, the first transistor T1 and the second transistor T2 are in OFF state when the control signal provided by the control signal terminal VG is at a high level, and the first transistor T1 and the second transistor T2 are in ON state when the control signal provided by the control signal terminal is at a low level. According to an embodiment, in FIG. 1, when the first transistor T1 and the second transistor T2 are in transient states or stable states, the bias voltage terminal VBIAS may provide a fixed bias voltage, where the bias voltage may have a level 40%~60% (e.g., 50%) of the high level of the control signal provided by the control signal terminal VG.

According to an embodiment, the variable resistance element Rv1 may provide a first resistance Ra when the first transistor T1 and the second transistor T2 are in the transient state. The variable resistance element Rv1 may provide a second resistance Rb larger than the first resistance Ra when the first transistor and the second transistor are in the ON state. The variable resistance element Rv1 may provide a third resistance Rc larger than the first resistance Ra when the first transistor T1 and the second transistor T2 are in the OFF state. In other words, it may be described as Table 1.

TABLE 1

| State of T1 and T2 | Resistance of Rv1 |
|---|---|
| Transient | Ra |
| ON | Rb |
| OFF | Rc |

Ra < Rb, and Ra < Rc

Figure 2:
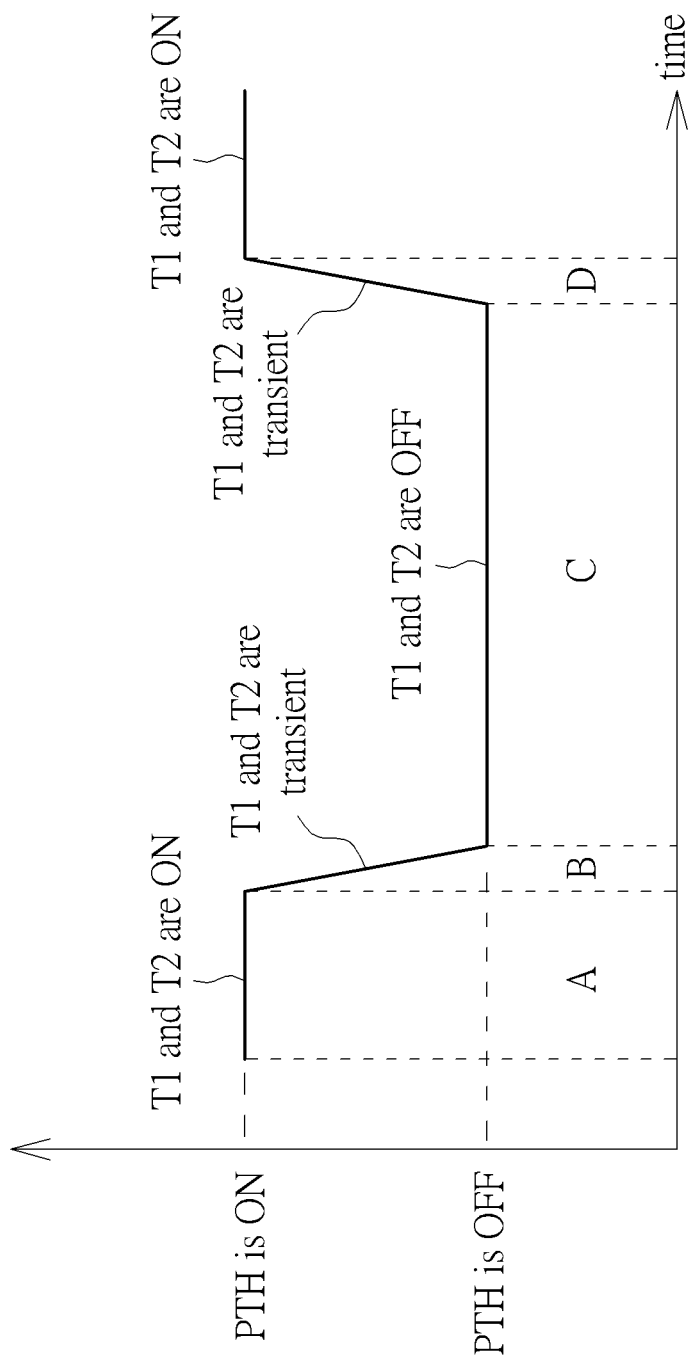
FIG. 2 illustrates the operations of the switch device of FIG. 1.

FIG. 2 illustrates the operations of the switch device 100 of FIG. 1. As shown in FIG. 1 and FIG. 2, in Phase A, the path PTH is in an ON state, where the first transistor T1 and the second transistor T2 are in the ON state, so that an RF signal may be transmitted from the RF terminal RF1 to the RF terminal RF2. In this case, the variable resistance element Rv1 may have a larger resistance Rb to reduce signal loss.

In Phase B, the first transistor T1 and the second transistor T2 are in the transient state, and the path PTH is being switched from the ON state to an OFF state. In this condition, in order to achieve a quick switch from the ON state to the OFF state for the transistors T1 and T2, the variable resistance element Rv1 may provide a smaller first resistance Ra, so that the voltage at the second terminal of the first transistor T1 (or the first terminal of the second transistor T2, or the node N1) may be quickly changed to approximate the voltage provided by the bias voltage terminal VBIAS.

In Phase C, the path PTH is in the OFF state, where the first transistor T1 and the second transistor T2 are in the OFF state. In this case, the variable resistance element Rv1 may have the larger resistance Rc to reduce signal loss.

In Phase D, like Phase B, the first transistor T1 and the second transistor T2 are in the transient state, and the path PTH is being switched from the OFF state to the ON state. In this condition, in order to achieve a quick switch from the OFF state to the ON state for the transistors T1 and T2, the variable resistance element Rv1 may provide the smaller first resistance Ra, so that the voltage at the second terminal of the first transistor T1 (or the first terminal of the second transistor T2, or the node N1) may be quickly changed to approximate the voltage provided by the bias voltage terminal VBIAS.

In an embodiment, the ideal value of the first resistance Ra is zero, and the ideal value of the second resistance Rb and the third resistance Rc is infinity. However, according to embodiments, the first resistance Ra, the second resistance Rb and the third resistance Rc may be properly determined according to the structure of the variable resistance element Rv1. According to an embodiment, the third resistance Rc may be substantially equal to the second resistance Rb, and for example, the difference therebetween may be not larger than 10% of each resistance.

FIG. 3 to FIG. 6 illustrate exemplary variable resistance elements Rv1 according to a plurality of embodiments. According to an embodiment, the variable resistance element Rv1 may include a set of resistors R1, and a switch SW1 coupled to the set of resistors R1. The switch SW1 may receive a control voltage signal and be in an ON state or an OFF state according to the control voltage signal. The operations of the switch SW1 may be described as Table 2.

TABLE 2

| State of T1 and T2 | State of the switch SW1 of Rv1 | Phase shown in FIG. 2 |
|---|---|---|
| Transient | ON | Phase B or Phase D |
| ON | OFF | Phase A |
| OFF | OFF | Phase C |

As shown in Table 1 and Table 2, when the first transistor T1 and the second transistor T2 are in the transient state, the switch SW1 is in an ON state, and the variable resistance element Rv1 may provide the smaller first resistance Ra. When the first transistor T1 and the second transistor T2 are in the stable state (e.g., the ON state or the OFF state), the switch SW1 is in an OFF state, and the variable resistance element Rv1 may provide the larger resistance Rb or Rc. For example, during Phase B or Phase D, a control terminal of the switch SW1 may receive a control voltage signal at a high level lasting a short time, so that the switch SW1 is in the ON state. In Phase A or Phase C, the control voltage signal at the control terminal of the switch SW1 may be kept at a relatively low level, so that the switch SW1 may be kept in the OFF state. In other words, the control voltage signal controlling the switch SW1 may have a pulse waveform.

Figure 3:
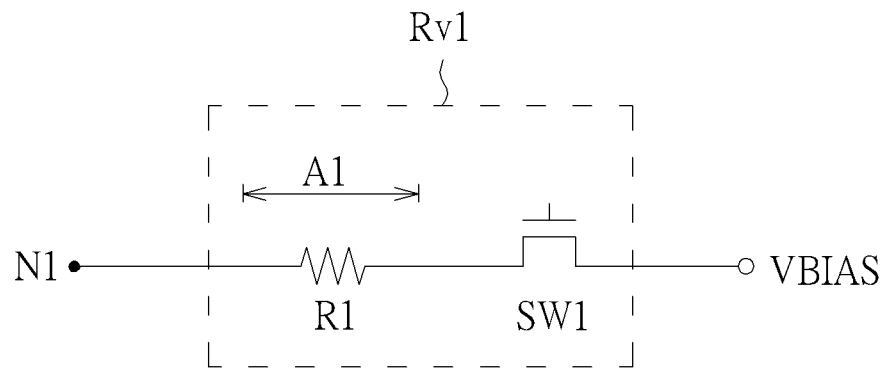
FIG. 3 to FIG. 6 illustrate exemplary variable resistance elements according to a plurality of embodiments.
Figure 4:
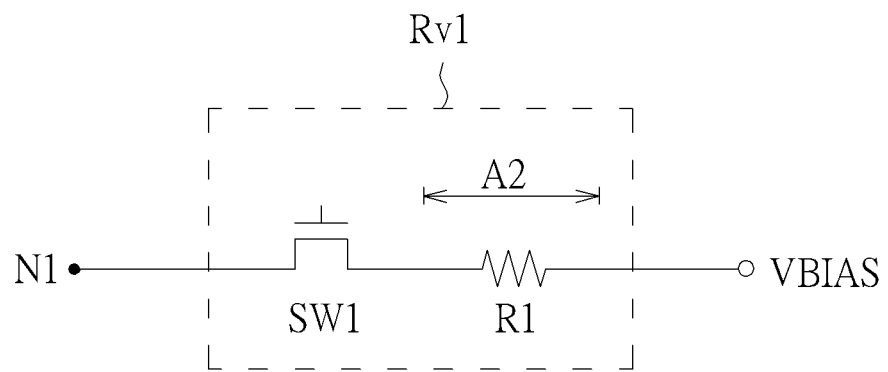

According to an embodiment, the set of resistors R1 may be coupled between the second terminal of the first transistor T1 (i.e. the node N1 of FIG. 1) and the switch SW1, i.e., the range A1 of FIG. 3, and/or may be coupled between the switch SW1 and the bias voltage terminal VBIAS, i.e., the range A2 of FIG. 4. As shown in FIG. 3, the set of resistors R1 may be coupled in the range A1, and the switch SW1 may be coupled between the set of resistors R1 and the bias voltage terminal VBIAS. As shown in FIG. 4, the switch SW1 may be coupled between the node N1 and the set of resistors R1, and the set of resistors R1 may be coupled in the range A2. FIG. 3 and FIG. 4 are merely examples, and the set of resistors R1 may include a plurality of resistors, such as two resistors coupled respectively in the range A1 and the range A2.

Figure 5:
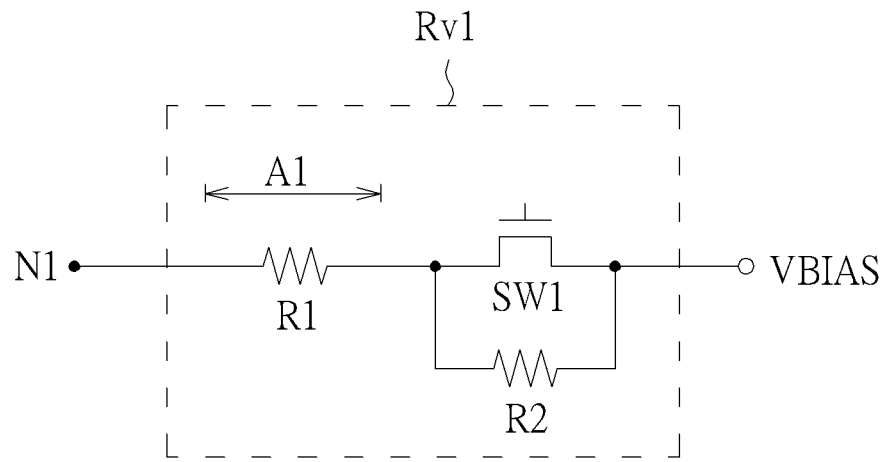
Figure 6:
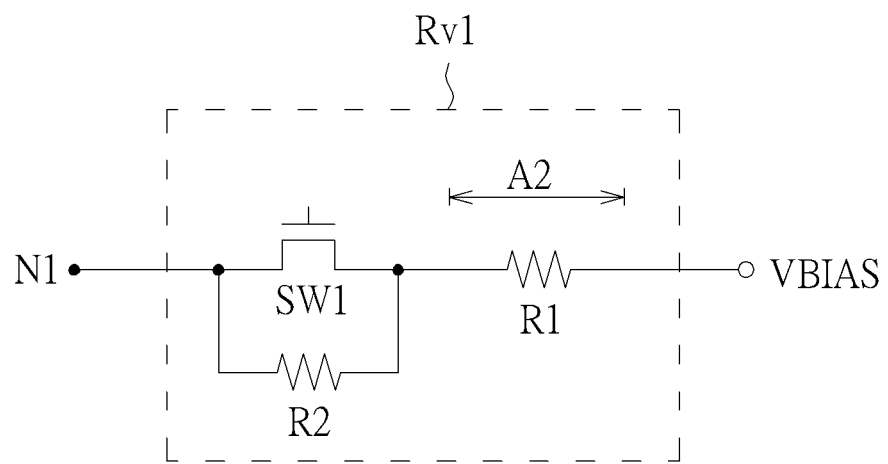

According to embodiments, as shown in FIG. 5 and FIG. 6, the variable resistance element Rv1 may further include a resistor R2, where a first terminal of the resistor R2 is coupled to the first terminal of the switch SW1, and a second terminal of the resistor R2 is coupled to the second terminal of the switch SW1. In other words, the resistor R2 may be coupled in parallel with the switch SW1. FIG. 5 and FIG. 6 are merely examples, and the set of resistors R1 may include a plurality of resistors, such as two resistors coupled respectively in the range A1 and the range A2.

According to embodiments, as shown in FIG. 3 to FIG. 6, the switch SW1 may include a transistor, where the size of the transistor may be smaller than the size of the first transistor T1, and may be further smaller than the size of the second transistor T2. Hence, compared to the transistor T1 or T2, the switch SW1 may have a more quick switching speed between the ON state and the OFF state, which may facilitate in quickly stabilizing the voltage level at the node N1 in time.

FIG. 3 to FIG. 6 are merely examples. According to an embodiment, the switch SW1 may include n sub-switches coupled in series, where a second terminal of an ith sub-switch may be coupled to a first terminal of the (i+1)th sub-switch, i and n are positive integers, and 0<i<n.

Figure 7:
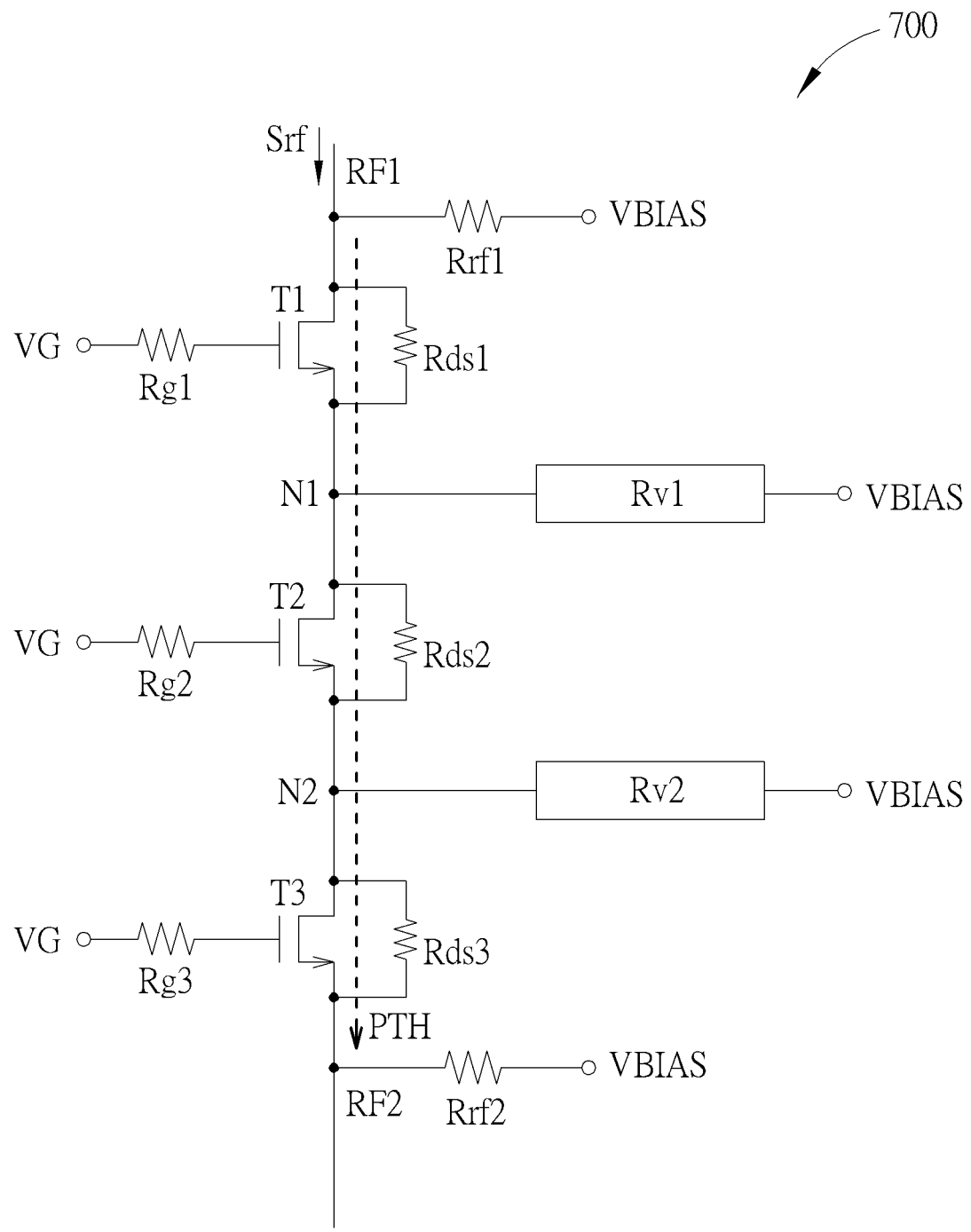
FIG. 7 illustrates a switch device according to another embodiment.

FIG. 7 illustrates a switch device 700 according to another embodiment. Compared with the switch device 100 of FIG. 1, the switch device 700 may further include a third transistor T3 and a second variable resistance element Rv2. The third transistor T3 may be coupled between the second transistor T2 and the RF terminal RF2. The third transistor T3 may include a first terminal, a second terminal and a control terminal, where the first terminal may be coupled to the second terminal of the second transistor T2 (i.e. the node N2 shown in FIG. 7), the second terminal may be coupled to the RF terminal RF2, and the control terminal may receive the control signal provided by the control signal terminal VG. The second variable resistance element Rv2 may include a first terminal and a second terminal, where the first terminal may be coupled to the node N2, and the second terminal may be coupled to the bias voltage terminal VBIAS. The third transistor T3 may be in an ON state, an OFF state or a transient state according to the control signal (e.g., a voltage signal) provided by the control signal terminal VG. The operations of the switch device 700 of FIG. 7 may be described as Table 3.

TABLE 3

| State of T1, T2 and T3 | Resistance of Rv1 | Resistance of Rv2 |
|---|---|---|
| Transient | Ra | Smaller resistance |
| ON | Rb | Larger resistance |
| OFF | Rc | Larger resistance |

Ra < Rb, and Ra < Rc

Like the variable resistance element Rv1, the second variable resistance element Rv2 may include a set of resistors, and a switch coupled to the set of resistors. The structure of the second variable resistance element Rv2 may be similar to that of the variable resistance element Rv1, for example, as shown in FIG. 3 to FIG. 6. As described above, switches included in the variable resistance element Rv1 and Rv2 may respectively include a transistor. The transistor included in the switch SW1 of the variable resistance element Rv1 may be of the same size or different size than the transistor included in the switch of the variable resistance element Rv2.

According to an embodiment, as shown in FIG. 1 and FIG. 7, each of the switch device 100 and the switch device 700 may further include an RF resistance Rrf1 coupled between the RF terminal RF1 and the bias voltage terminal VBIAS. Each of the switch device 100 and the switch device 700 may further include an RF resistance Rrf2 coupled between the RF terminal RF2 and the bias voltage terminal VBIAS. According to an embodiment, the resistance of the RF resistor Rrf1 may be substantially equal to the resistance of the RF resistor Rrf2.

When the switch SW1 is in the ON state, the variable resistance element Rv1 may provide the first resistance Ra, and the first resistance Ra may be substantially equal to the resistance of the resistor R1, as shown in FIG. 3. Further, in an embodiment, referring to FIG. 1 and FIG. 3, the resistance of the resistor R1 may be smaller than the resistance of the RF resistor Rrf1, and the first resistance Ra of the variable resistance element Rv1 may therefore be smaller than the resistance of the RF resistor Rrf1.

According to an embodiment, as shown in FIG. 1 and FIG. 7, each of the switch device 100 and switch device 700 may further include an operation resistor Rds1 and an operation resistor Rds2. The operation resistor Rds1 may be coupled between the first terminal and the second terminal of the first transistor T1. The operation resistor Rds2 may be coupled between the first terminal and the second terminal of the second transistor T2. According to an embodiment, as shown in FIG. 7, the switch device 700 may further include an operation resistor Rds3 coupled between the first terminal and the second terminal of the third transistor T3.

According to an embodiment, as shown in FIG. 1 and FIG. 7, each of the switch device 100 and the switch device 700 may further include a control resistor Rg1 and a control resistor Rg2. The control resistor Rg1 may be coupled between the control terminal of the first transistor T1 and the control signal terminal VG. The control resistor Rg2 may be coupled between the control terminal of the second transistor T2 and the control signal terminal VG. According to an embodiment, as shown in FIG. 7, the switch device 700 may further include a control resistor Rg3 coupled between the control terminal of the third transistor T3 and the control signal terminal VG.

Figure 8:
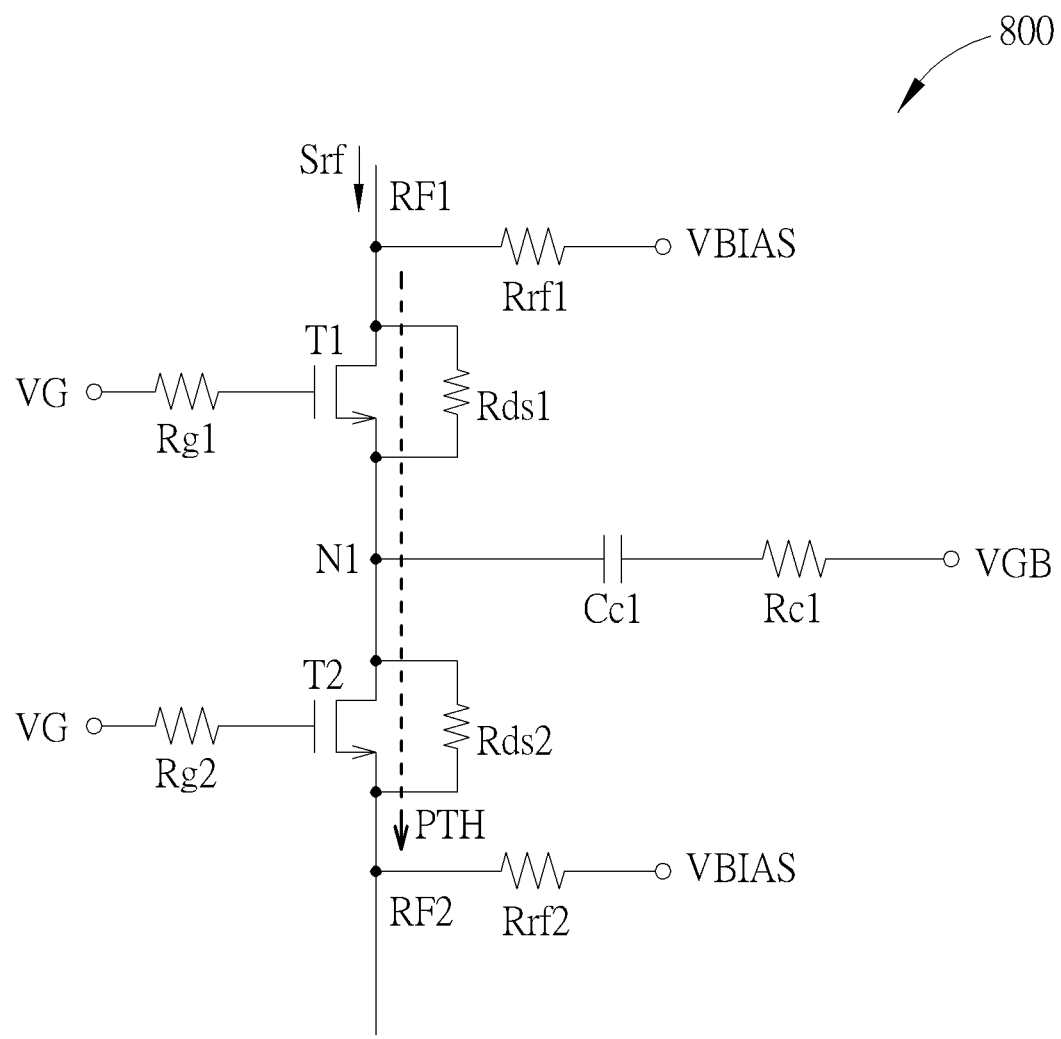
FIG. 8 illustrates a switch device according to another embodiment.

FIG. 8 illustrates a switch device 800 according to another embodiment. The switch device 800 may be similar to the switch device 100 of FIG. 1. The difference is that the switch device 800 may include a capacitor Cc1 instead of the variable resistance element Rv1. The capacitor Cc1 may be coupled between the second terminal of the first transistor T1 (i.e. the node N1) and the control signal terminal VGB providing a control signal.

Figure 9:
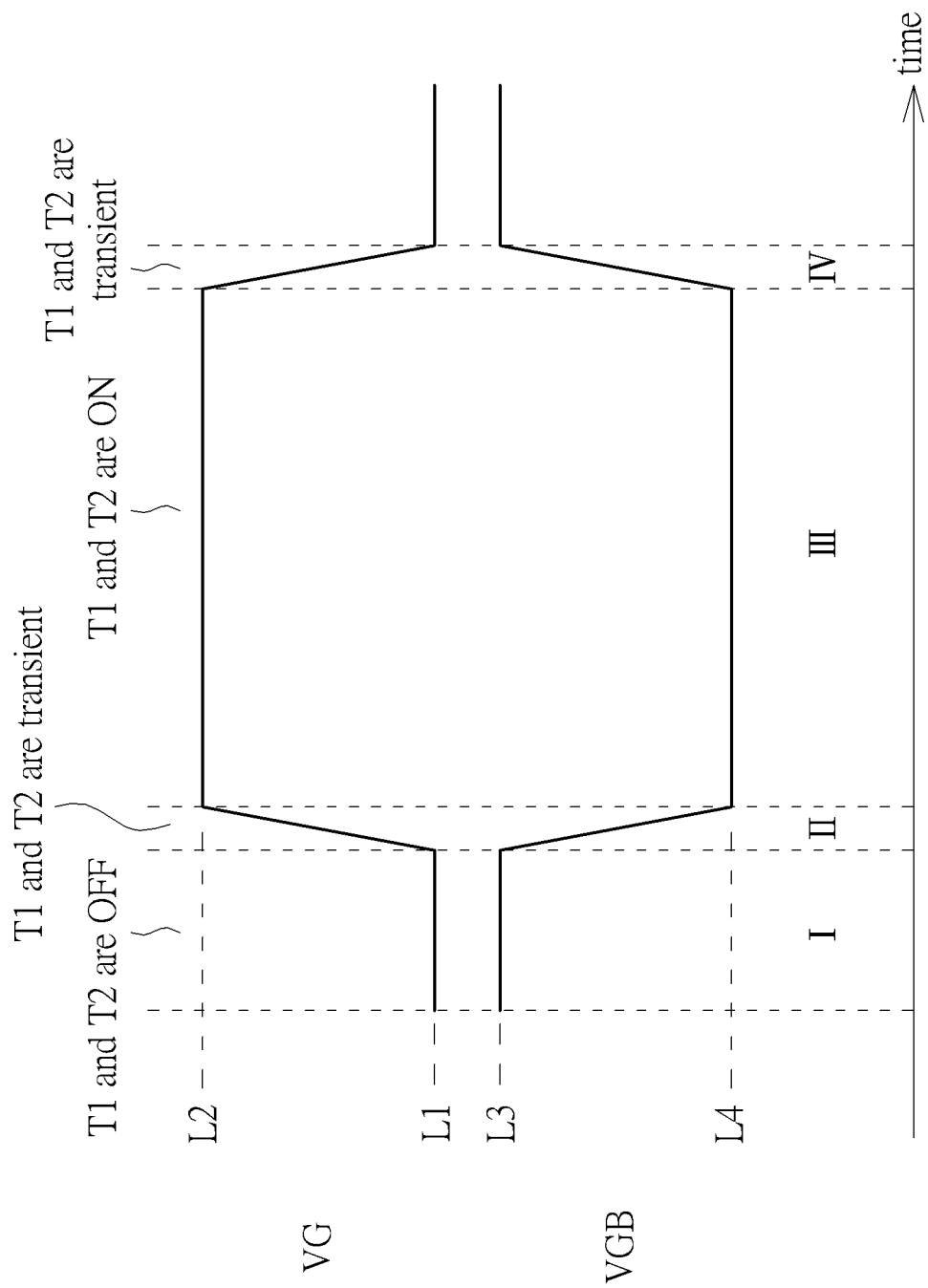
FIG. 9 illustrates exemplary control signals shown in FIG. 8.

FIG. 9 illustrates the levels of the control signals respectively provided by the control signal terminal VG and the control signal terminal VGB shown in FIG. 8.

For example, as shown in FIG. 8 and FIG. 9, according to the levels of the control signal provided by the control signal terminal VG, in Phase I, the first transistor T1 and the second transistor T2 may be in the OFF state and hence in the stable state. In Phase II, the first transistor T1 and the second transistor T2 may be switched from the OFF state to the ON state and hence in the transient state. In Phase III, the first transistor T1 and the second transistor T2 may be in the ON state and hence in the stable state. In Phase IV, the first transistor T1 and the second transistor T2 may be switched from the ON state to the OFF state and hence in the transient state. When the first transistor T1 and the second transistor T2 are in the transient state, for example, in Phase II, the voltage signal provided by the control signal terminal VG may change from a first level L1 to a second level L2, and the voltage signal provided by the control signal terminal VGB may change from a third level L3 to a fourth level L4.

According to an embodiment, at the node N1, an impact caused by the voltage change in the signal provided by the control signal terminal VGB may at least partially counteract an impact caused by the voltage change in the signal provided by the control signal terminal VG. As shown in FIG. 8 and FIG. 9, for example, a parasitic capacitor may be present between the control terminal and the second terminal (e.g., source terminal) of the first transistor T1. In Phase II, the voltage signal provided by the control signal terminal VG may change from the lower level L1 to the higher level L2, and such a voltage change may pull up the voltage level at the node N1 by ways of the capacitive coupling caused by the parasitic capacitor between the control terminal and the second terminal of the transistor T1. According to an embodiment, with the configuration of the capacitor Cc1, a first terminal of the capacitor Cc1 is coupled to the node N1, and a second terminal of the capacitor Cc1 may receive the voltage signal provided by the control signal terminal VGB. In Phase II, the voltage signal may change from the higher level L3 to the lower level L4, and thus the voltage signal provided by the control signal terminal VGB may pull down the voltage level at the node N1 through the coupling effect of the capacitor Cc1. Since the impact on the voltage level at the node N1 caused by the voltage change from the control signal terminal VG may be opposite to that caused by the voltage change from the control signal terminal VGB, the voltage level at the node N1 may be kept relatively stable, or further may be properly lowered (in Phase II), such that the first transistor T1 may enter the ON state more quickly. In other words, the voltage change from the control signal terminal VGB may be used to reduce the impact caused by the voltage change from the control signal terminal VG. Hence, the voltage level at the node N1 may be prevented from being pulled up by the control signal terminal VG, where such a pull up may result in a low speed for the first transistor T1 to be turned on. Similarly, in Phase IV, the voltage signal provided by the control signal terminal VG may change from the higher level L2 to the lower level L1, and such a change may pull down the voltage level at the node N1 through the coupling effect of the parasitic capacitor. Correspondingly, still in Phase IV, the voltage signal provided by the control signal terminal VGB may change from the lower level L4 to the higher level L3, and such a change may pull up voltage level at the node N1 through the coupling effect of the capacitor Cc1. Since the voltage change from the control signal terminal VG and that from the control signal terminals VGB may be opposite, their impacts on the voltage level at the node N1 may also be opposite. Thus, the voltage level at the node N1 may be kept relatively stable, or further may be properly pulled up (in Phase IV), such that the first transistor T1 may enter the OFF state more quickly. In other words, the voltage change from the control signal terminal VGB may be used to reduce the impact caused by the voltage change from the control signal terminal VG. Hence, the voltage level at the node N1 may be prevented from being pulled down by the control signal terminal VG, where such a pull down may result in a low speed for the first transistor T1 to be turned off. As a result, the transient response is speeded up.

According to an embodiment, the voltage signals respectively provided by the control signal terminal VG and the control signal terminals VGB may be complementary, such as complementary in phase, and may change simultaneously. Hence, the first level L1 may be substantially equal to the fourth level L4, and the second level L2 may be substantially equal to the third level L3.

The first transistor T1 and the second transistor T2 may be N-type as shown in FIG. 8, but this is an example. In another example, the first transistor T1 and the second transistor T2 may be P-type, where the first level L1 may be higher than the second level L2, and the third level L3 may be lower than the fourth level L4.

In FIG. 8, when the first transistor T1 and the second transistor T2 are in the transient state (e.g., from the ON state to the OFF state, or the OFF state to the ON state), the voltage signals respectively provided by the control signal terminal VG and the control signal terminal VGB may change in level, and by means of the coupling effect of the parasitic capacitor and that of the capacitor Cc1, the voltage level at the second terminal of the first transistor T1 may be substantially stable. For example, the voltage level at the second terminal of the first transistor T1 may be substantially equal to the voltage level of the bias voltage provided by the bias voltage terminal VBIAS.

As shown in FIG. 8, the switch device 800 may further include the control resistor Rg1 and the resistor Rc1. The control resistor Rg1 may be coupled between the control terminal of the first transistor T1 and the control signal terminal VG. The resistor Rc1 may be coupled between the capacitor Cc1 and the control signal terminal VGB. According to an embodiment, the resistance of the control resistor Rg1 may be substantially equal to the resistance of the resistor Rc1. The capacitance of the capacitor Cc1 may be substantially equal to the capacitance of a parasitic capacitor presented between the control terminal and the second terminal (e.g., source terminal) of the first transistor T1. In this way, between the control signal terminal VG and the control signal terminal VGB, a substantially symmetric circuit structure with a center at the node N1 is formed by using the control resistor Rg1, the parasitic capacitor, the capacitor Cc1 and the resistor Rc1. In some embodiments, the capacitor Cc1 and the resistor Rc1 may be implemented with a metal-oxide-semiconductor field-effect transistor (MOSFET).

Figure 10:
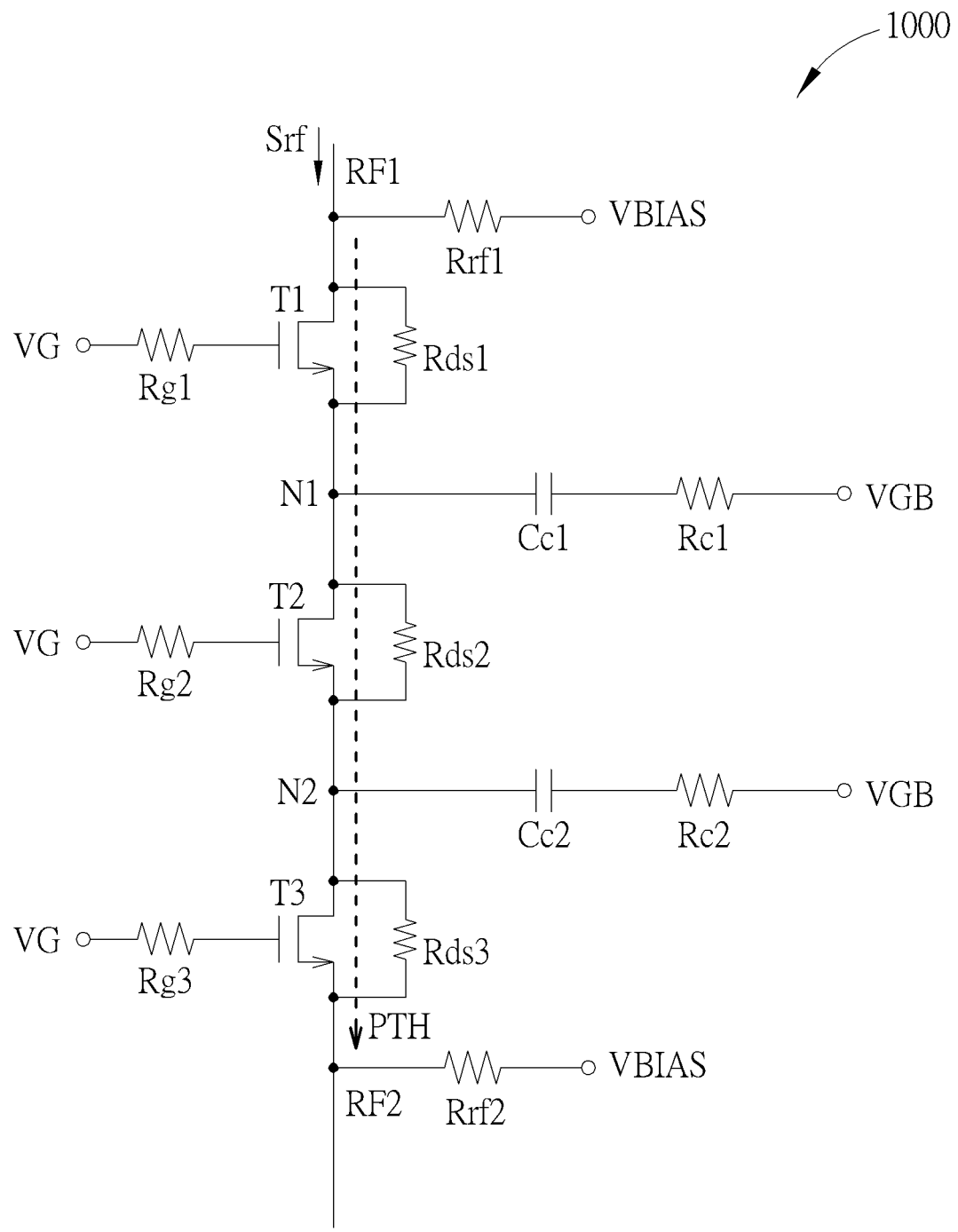
FIG. 10 illustrates a switch device according to another embodiment.

FIG. 10 illustrates a switch device 1000 according to another embodiment. The switch device 1000 may be similar to the switch device 800 shown in FIG. 8, and the difference is that the switch device 1000 further includes a third transistor T3 and a capacitor Cc2. The third transistor T3 may be coupled between the second transistor T2 and the second RF terminal RF2, and include a first terminal, a second terminal and a control terminal, where the first terminal is coupled to the second terminal of the second transistor T2 (e.g., the node N2), the second terminal is coupled to the RF terminal RF2, and the control terminal is used to receive the voltage signal provided by the control signal terminal VG. The capacitor Cc2 may be coupled between the node N2 and the control signal terminal VGB. Like FIG. 8, when the third transistor T3 is in a transient state according to the voltage signal provided by the control signal terminal VG, the voltage signal provided by the control signal terminal VGB may be used to, through the capacitor Cc2, reduce the impact on the voltage level at node N2 caused by the voltage change provided by the control signal terminal VG.

As shown in FIG. 8 and FIG. 10, the switch device 800 and the switch device 1000 may further include the control resistor Rg2 and the resistor Rc2. The control resistor Rg2 may be coupled between the control terminal of the second transistor T2 and the control signal terminal VG. The resistor Rc2 may be coupled between the capacitor Cc2 and the control signal terminal VGB. The switch device 1000 may further include a control resistor Rg3, coupled between the control terminal of the third transistor T3 and the control signal terminal VG.

Figure 11:
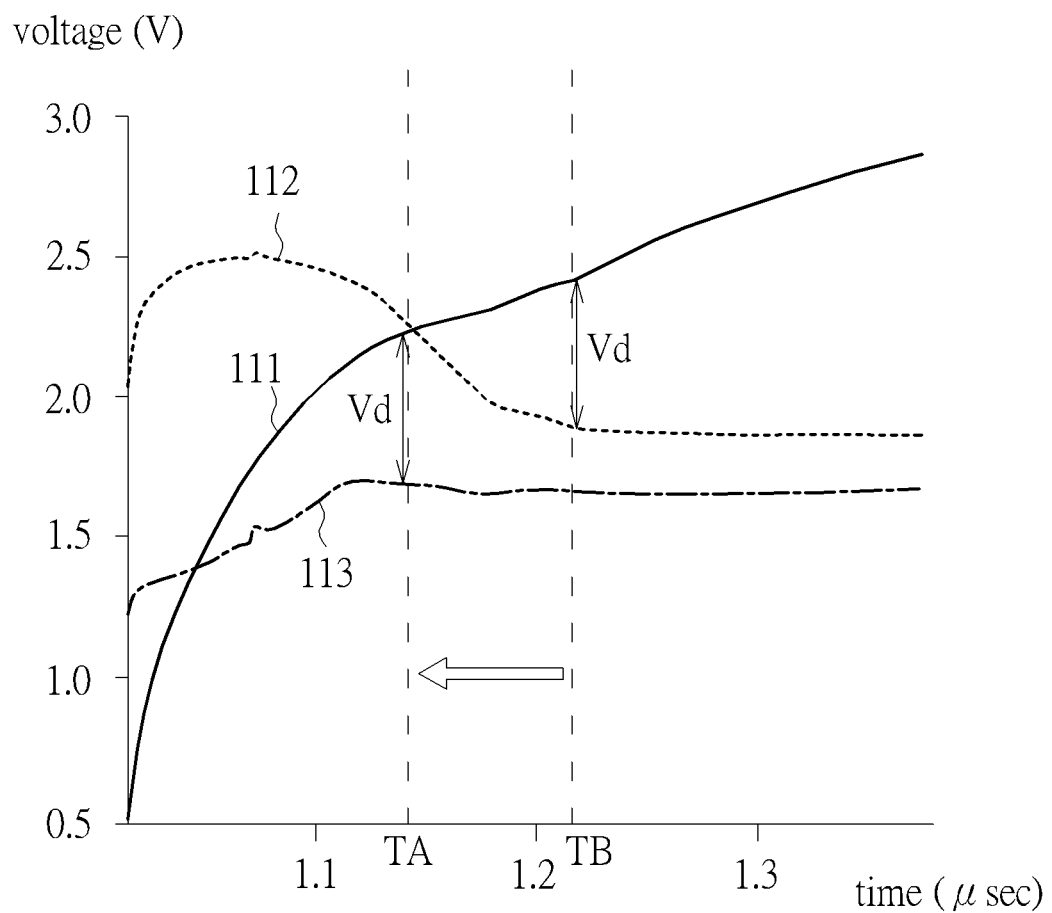
FIG. 11 illustrates results before and after the improvement according to an embodiment.

FIG. 11 is a curve diagram showing the results before and after using the solution of the disclosure to improve the response time in accordance with an embodiment. The vertical axis of FIG. 11 is corresponding to voltage, and the unit is volt. The horizontal axis of FIG. 11 is corresponding to time, and the unit is microsecond (pec). The curve 111 shows the level change of the voltage signal provided by the control signal terminal VG, for example, the change of the voltage level at the control terminal of the transistor T1. When the voltage signal provided by the control signal VG changes, the voltage level at the node N1 changes accordingly. The curve 112 shows the voltage change at the node N1 before the improvement, and the curve 113 shows the voltage change at the node N1 after the improvement.

As shown by the curve 111 of FIG. 11, taking transistor T1 as an example, the level of the voltage signal provided by the control signal terminal VG (e.g., the voltage level at the control terminal of the transistor T1) is changing from a lower level to a higher level.

As shown by the curve 112, without using an switch device of an embodiment, the voltage level at the node N1 (i.e. the voltage level at the source terminal of the transistor T1) rises due to the level rising of the voltage signal provided by the control signal terminal VG. At a time point TB, the voltage difference between the control terminal and the source terminal of the transistor T1 may reach Vd, and the transistor T1 may enter the ON state and then stay in a stable state. The voltage difference Vd may be not lower than a threshold voltage of the transistor T1.

As shown by the curve 113, with using an switch device of an embodiment, the impact on the voltage level at the node N1 caused by the voltage change provided by the control signal terminal VG may be reduced. For example, the voltage level at the node N1 (i.e. the voltage level at the source terminal of the transistor T1) may not be significantly pulled up, and may be, for example, kept relatively stable. At a time point TA, the voltage difference between the control terminal and the source terminal of the transistor T1 may reach Vd, and the transistor T1 may enter the ON state and then stay in the stable state. Since the time point TA precedes the time point TB, the transistor T1 enters the stable state earlier by using the switch device of an embodiment. According to the experiment results of FIG. 11, a switch device of an embodiment speeds up the transient response.

In summary, by means of the switch device provided by an embodiment, the transient response of transistors on the RF signal transmitting path may be speeded up, improving the operation speed of the RF switch device.

Those skilled in the art may readily observe that numerous modifications and alterations of the device and method may be made while retaining the teachings of the invention. Accordingly, the above disclosure should be construed as limited only by the metes and bounds of the appended claims.

What is claimed is:

1. A switch device comprising:
    a first radio-frequency (RF) terminal, configured to receive an RF signal and coupled to a bias voltage terminal, wherein the bias voltage terminal provides a bias voltage;
    a second RF terminal, configured to receive the RF signal through a predetermined path and coupled to the bias voltage terminal, wherein the predetermined path is between the first RF terminal and the second RF terminal;
    a first transistor, comprising a first terminal coupled to the first RF terminal, a second terminal, and a control terminal;
    a second transistor, comprising a first terminal coupled to the second terminal of the first transistor, a second terminal coupled to the second RF terminal, and a control terminal;
    a first variable resistance element, comprising a first terminal coupled to the second terminal of the first transistor, and a second terminal coupled to the bias voltage terminal;
    a third transistor coupled between the second transistor and the second RF terminal, wherein the third transistor comprises a first terminal coupled to the second terminal of the second transistor, a second terminal coupled to the second RF terminal, and a control terminal configured to receive a first control signal; and a second variable resistance element comprising a first terminal coupled to the second terminal of the second transistor, and a second terminal coupled to the bias voltage terminal;

wherein:

the first variable resistance element provides a first resistance when the first transistor and the second transistor are in a transient state according to the first control signal;

the first variable resistance element provides a second resistance when the first transistor and the second transistor are in an ON state according to the first control signal, and the second resistance is larger than the first resistance; and the third transistor is in an ON state, an OFF state, or a transient state according to the first control signal.

2. The switch device of claim 1, wherein the first variable resistance element provides a third resistance when the first transistor and the second transistor are in an OFF state according to the first control signal, and the third resistance is larger than the first resistance.

3. The switch device of claim 2, wherein the third resistance is substantially equal to the second resistance.

4. The switch device of claim 2, wherein:

the first variable resistance element further comprises a set of first resistors and a switch coupled to the set of first resistors;

the first switch is in an ON state when the first transistor and the second transistor are in the transient state;

the first switch is in an OFF state when the first transistor and the second transistor are in the ON state; and the first switch is in the OFF state when the first transistor and the second transistor are in an OFF state.

5. The switch device of claim 4, wherein:

the set of first resistors is coupled between the second terminal of the first transistor and the first switch, and/or the set of first resistors is coupled between the first switch and the bias voltage terminal; and the first variable resistance element further comprises a second resistor;

wherein:

the first switch comprises a first terminal and a second terminal couple to the bias voltage terminal, the set of first resistors is coupled between the second terminal of the first transistor and the first terminal of the first switch, and the second resistor is coupled between the first terminal of the first switch and the bias voltage terminal; or the first switch comprises a first terminal coupled to the second terminal of the first transistor and a second terminal, the second resistor is coupled between the second terminal of the first transistor and the second terminal of the first switch, and the set of first resistors is coupled between the second terminal of the first switch and the bias voltage terminal.

6. The switch device of claim 4, wherein the first switch comprises a transistor, and a size of the transistor of the first switch is smaller than a size of the first transistor, and smaller than a size of the second transistor.

7. The switch device of claim 1, wherein:

the first variable resistance element further comprises a set of first resistors and a first switch coupled to the set of first resistors;

the second variable resistance element further comprises a second resistor and a second switch coupled to the second resistor; and a transistor of the first switch and a transistor of the second switch are of different sizes.

8. The switch device of claim 1, further comprising a first RF resistor coupled between the first RF terminal and the bias voltage terminal.

9. The switch device of claim 8, further comprising a second RF resistor coupled between the second RF terminal and the bias voltage terminal.

10. The switch device of claim 9, wherein a resistance of the first RF resistor is substantially equal to a resistance of the second RF resistor, and the first resistance is smaller than the resistance of the first RF resistor.

11. The switch device of claim 1, further comprising:

a first operation resistor coupled between the first terminal of the first transistor and the second terminal of the first transistor; and a second operation resistor coupled between the first terminal of the second transistor and the second terminal of the second transistor.

12. The switch device of claim 1, further comprising:

a first control resistor coupled between the control terminal of the first transistor and a first control signal terminal, wherein the first control signal terminal provides the first control signal; and a second control resistor coupled between the control terminal of the second transistor and the first control signal terminal.

13. A switch device comprising:

a first radio-frequency (RF) terminal, configured to receive an RF signal and coupled to a bias voltage terminal, wherein the bias voltage terminal provides a bias voltage;

a second RF terminal, configured to receive the RF signal through a predetermined path and coupled to the bias voltage terminal, wherein the predetermined path is between the first RF terminal and the second RF terminal;

a first transistor, comprising a first terminal coupled to the first RF terminal, a second terminal, and a control terminal for receiving a first control signal;

a second transistor, comprising a first terminal coupled to the second terminal of the first transistor, a second terminal coupled to the second RF terminal, and a control terminal for receiving the first control signal; and a first capacitor, coupled between the second terminal of the first transistor and a second control signal terminal, wherein the second control signal terminal provides a second control signal;

wherein when the first transistor and the second transistor are in a transient state according to the first control signal, the first control signal changes from a first level to a second level, and the second control signal changes from a third level to a fourth level.

14. The switch device of claim 13, wherein, as for a voltage level at the second terminal of the first transistor, an impact caused by a change of the second control signal reduces an impact caused by a change of the first control signal.

15. The switch device of claim 14, wherein when the first transistor and the second transistor are in the transient state according to the first control signal, a level at the second terminal of the first transistor is substantially equal to the bias voltage according to the first control signal and the second control signal.

16. The switch device of claim 13, wherein the first control signal and the second control signal are complementary and change simultaneously.

17. The switch device of claim 13, further comprising:
a first control resistor, coupled between the control terminal of the first transistor and a first control signal terminal, wherein the first control signal terminal provides the first control signal; and
a first resistor, coupled between the first capacitor and the second control signal terminal;
wherein a resistance of the first control resistor is substantially equal to a resistance of the first resistor, and a capacitance of a parasitic capacitor between the control terminal of the first transistor and the second terminal of the first transistor is substantially equal to a capacitance of the first capacitor.

18. The switch device of claim 13, further comprising:
a third transistor, coupled between the second transistor and the second RF terminal, wherein the third transistor comprises a first terminal coupled to the second terminal of the second transistor, a second terminal coupled to the second RF terminal, and a control terminal configured to receive the first control signal; and
a second capacitor, coupled between the second terminal of the second transistor and the second control signal terminal.

19. The switch device of claim 18, further comprising:
a first control resistor, coupled between the control terminal of the first transistor and a first control signal terminal, wherein the first control signal terminal provides the first control signal;
a first resistor, coupled between the first capacitor and the second control signal terminal;
a second control resistor, coupled between the control terminal of the second transistor and the first control signal terminal; and
a second resistor, coupled between the second capacitor and the second control signal terminal.

* * * * *